United States Patent
Ikeya et al.

(10) Patent No.: US 8,841,714 B2
(45) Date of Patent: *Sep. 23, 2014

(54) SOLID STATE IMAGING DEVICE

(75) Inventors: Tomohiro Ikeya, Hamamatsu (JP);
Yasuhito Yoneta, Hamamatsu (JP);
Hisanori Suzuki, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/979,172

(22) PCT Filed: Nov. 11, 2011

(86) PCT No.: PCT/JP2011/076091
§ 371 (c)(1),
(2), (4) Date: Jul. 11, 2013

(87) PCT Pub. No.: WO2012/096051
PCT Pub. Date: Jul. 19, 2012

(65) Prior Publication Data
US 2013/0292742 A1    Nov. 7, 2013

(30) Foreign Application Priority Data
Jan. 14, 2011   (JP) ................. 2011-005890

(51) Int. Cl.
*H01L 31/02*     (2006.01)
*H01L 27/148*    (2006.01)
*H04N 5/372*     (2011.01)
*H01L 27/146*    (2006.01)

(52) U.S. Cl.
CPC .... *H01L 27/14806* (2013.01); *H01L 27/14831* (2013.01); *H04N 5/37213* (2013.01); *H01L 27/14601* (2013.01)

USPC ........... 257/292; 257/443; 257/447; 257/460; 257/E27.131; 257/E27.152; 257/E27.154; 257/E31.053; 257/E3.124

(58) Field of Classification Search
CPC ................. H01L 27/14831; H01L 27/14887; H01L 27/14603; H01L 27/14643; H01L 27/14843; H01L 27/14812; H01L 31/0224; H01L 31/02; H01L 31/062; H01L 29/02; H01L 29/1062
USPC .......... 257/292, 443, 447, 460, E27.131, 152, 257/154, 31.053, 31.124
See application file for complete search history.

(56) References Cited

U.S. PATENT DOCUMENTS 4,168,444 A  *  9/1979  van Santen ............ 327/515
5,365,093 A  *  11/1994 Kuno ...................... 257/233

(Continued)

FOREIGN PATENT DOCUMENTS

EP   2 093 801    8/2009
JP   60-084868    5/1985

(Continued)

*Primary Examiner* — Michael Lebentritt
(74) *Attorney, Agent, or Firm* — Drinker Biddle & Reath LLP (57) ABSTRACT

A solid state imaging device 1 is provided with a photoelectric conversion portion 2 having a plurality of photosensitive regions 7, and a potential gradient forming portion 3 having an electroconductive member 8 arranged opposite to the photosensitive regions 7. A planar shape of each photosensitive region 7 is a substantially rectangular shape. The photosensitive regions 7 are juxtaposed in a first direction intersecting with the long sides. The potential gradient forming portion 3 forms a potential gradient becoming higher along a second direction from one of the short sides to the other of the short sides of the photosensitive regions 7. The electroconductive member 8 includes a first region 8a extending in the second direction and having a first electric resistivity, and a second region 8b extending in the second direction and having a second electric resistivity smaller than the first electric resistivity.

5 Claims, 7 Drawing Sheets

(56) References Cited

U.S. PATENT DOCUMENTS

| | | | |
|---|---|---|---|
| 5,965,910 A | 10/1999 | Wood | |
| 7,446,358 B2 * | 11/2008 | Kanbe | 257/292 |
| 7,479,686 B2 * | 1/2009 | Costello et al. | 257/443 |
| 8,415,604 B2 * | 4/2013 | Suzuki et al. | 250/208.1 |
| 8,426,902 B2 * | 4/2013 | Masuoka et al. | 257/292 |
| 2012/0025281 A1 * | 2/2012 | Masuoka et al. | 257/292 |
| 2013/0270609 A1 * | 10/2013 | Takagi et al. | 257/231 |
| 2013/0285188 A1 * | 10/2013 | Ikeya et al. | 257/447 |

FOREIGN PATENT DOCUMENTS

| | | |
|---|---|---|
| JP | 4-115574 | 4/1992 |
| JP | 6-140442 A | 5/1994 |
| JP | H6-236987 | 8/1994 |
| JP | 7-130989 A | 5/1995 |
| JP | 2001-060681 | 3/2001 |
| JP | 2005-223258 | 8/2005 |
| JP | 2005-268564 A | 9/2005 |
| JP | 2007-259417 | 10/2007 |
| JP | 2009-272333 A | 11/2009 |

\* cited by examiner

SOLID STATE IMAGING DEVICE

TECHNICAL FIELD

The present invention relates to a solid state imaging device.

BACKGROUND ART

There is a known solid state imaging device provided with a photoelectric conversion portion having a plurality of photosensitive regions to generate respective charges according to incidence of light, and a potential gradient forming portion having an electroconductive member arranged opposite to the photosensitive regions (e.g., cf. Patent Literature 1). In the solid state imaging device described in Patent Literature 1, the potential gradient forming portion forms a potential gradient becoming higher along a predetermined direction. The charges are moved by this potential gradient, thereby achieving increase of charge readout speed.

CITATION LIST

Patent Literature

Patent Literature 1: Japanese Patent Application Laid-open No. 2005-268564

SUMMARY OF INVENTION

Technical Problem

The electric resistance of the electroconductive member is set in view of stability of operation and characteristics of the solid state imaging device. For example, the electric resistance of the electroconductive member is set so as to achieve a sufficient readout speed for amounts of the charges generated in the photosensitive regions and so as to prevent increase of dark current by suppressing an amount of heat generated in the electroconductive member. However, there is individual variability in the electroconductive member and if this individual variability causes dispersion of electric resistance of the electroconductive member among products, it may pose a problem that it becomes difficult to ensure the stability of operation and characteristics of the solid state imaging device.

Therefore, an object of the present invention is to provide a solid state imaging device which causes less variability in the electric resistance of the electroconductive member of the potential gradient forming portion and which can ensure the stability of operation and characteristics.

Solution to Problem

The Inventors conducted a research study on the individual variability of the electroconductive member and, particularly, on dispersion of electric resistivity (electric resistance), and found the phenomenon as discussed below. The dispersion of electric resistivity of the electroconductive member varies depending upon values of electric resistivity. For example, when the electroconductive member used is one comprised of polysilicon, there is such a tendency that the dispersion is less likely to occur with the electric resistivity being set low, while the dispersion is more likely to occur with the electric resistivity being set high. Therefore, the dispersion can be reduced if the electric resistivity of the electroconductive member is set to a value less likely to cause the dispersion. However, the value set with consideration of the dispersion is not always one enough to ensure the stability of operation and characteristics of the solid state imaging device, and therefore it is difficult to solve the aforementioned problem.

In the light of the above-described phenomenon, the present invention provides a solid state imaging device comprising: a photoelectric conversion portion having a plurality of photosensitive regions which generate respective charges according to incidence of light and a planar shape of each of which is a substantially rectangular shape composed of two long sides and two short sides, the photosensitive regions being juxtaposed in a first direction intersecting with the long sides; a potential gradient forming portion having an electroconductive member arranged opposite to the plurality of photosensitive regions, and forming a potential gradient becoming higher along a second direction from one of the short sides to the other of the short sides of the photosensitive regions; and a charge output portion which acquires the charges transferred from the respective photosensitive regions and which transfers the charges in the first direction to output the charges, wherein the electroconductive member includes a first region extending in the second direction between two ends in the second direction and having a first electric resistivity, and a second region extending in the second direction between the two ends and having a second electric resistivity smaller than the first electric resistivity.

In the solid state imaging device according to the present invention, the electroconductive member includes the first region having the first electric resistivity, and the second region having the second electric resistivity smaller than the first electric resistivity. Since the electric resistivities of the first region and the second region are different, the dispersion of electric resistivity is less likely to occur in one of the first region and the second region than in the other. For this reason, the dispersion of electric resistivity is kept lower for the whole of the electroconductive member.

In the present invention, the electric resistance of the electroconductive member is represented by a combined resistance of parallel connection of the electric resistance of the first region and the electric resistance of the second region. Therefore, it is sufficient that the combined resistance of the electric resistance of the first region and the electric resistance of the second region be set to a value enough to ensure the stability of operation and characteristics of the solid state imaging device. For this reason, the electric resistance of the electroconductive member can be readily set to the value enough to ensure the stability of operation and characteristics of the solid state imaging device, without affecting the suppression of dispersion.

The electroconductive member may be comprised of polysilicon doped with an impurity, and a concentration of the impurity in the second region may be higher than in the first region. In this case, the electroconductive member comprised of polysilicon includes the first region and the second region having the different electric resistivities. Therefore, it is feasible to ensure the stability of operation and characteristics of the solid state imaging device, while keeping the dispersion of electric resistivity of the electroconductive member low.

The electroconductive member may include a plurality of first regions and a plurality of second regions, and the first regions and the second regions may be alternately arranged along the first direction. In this case, the charge readout speed and amount of heat generated in the electroconductive member become substantially uniform in the first direction, so as to make the operation and characteristics of the solid state imaging device more stabilized.

The second regions may be arranged corresponding to the respective photosensitive regions. In this case, the charge readout speed and the amount of heat generated in the electroconductive member become substantially uniform in each of the photosensitive regions, so as to make the operation and characteristics of the solid state imaging device more stabilized.

The potential gradient forming portion may further include a pair of electrodes connected respectively to two ends thereof and extending along the first direction. In this case, potentials at the two ends of the electroconductive member become substantially uniform in the first direction and the potential gradient is formed substantially uniformly in the first direction. As a result of this, the operation and characteristics of the solid state imaging device become more stabilized.

Advantageous Effect of Invention

The present invention can provide the solid state imaging device less likely to cause the dispersion of electric resistance of the electroconductive member of the potential gradient forming portion and capable of ensuring the stability of operation and characteristics.

DESCRIPTION OF EMBODIMENTS

The preferred embodiments of the present invention will be described below in detail with reference to the accompanying drawings. In the description, identical elements or elements with identical functionality will be denoted by the same reference signs, without redundant description.

Figure 1:
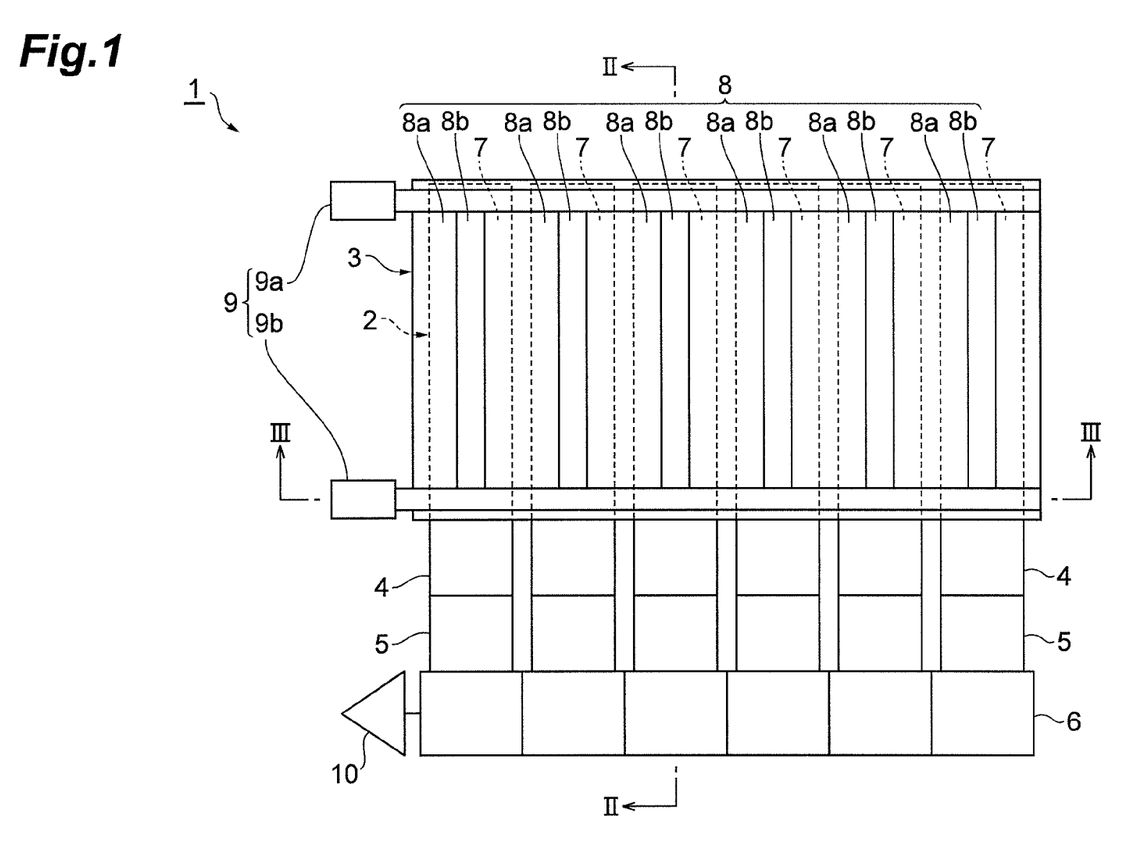
FIG. 1 is a plan view showing a configuration of a solid state imaging device according to an embodiment of the present invention.
Figure 2:
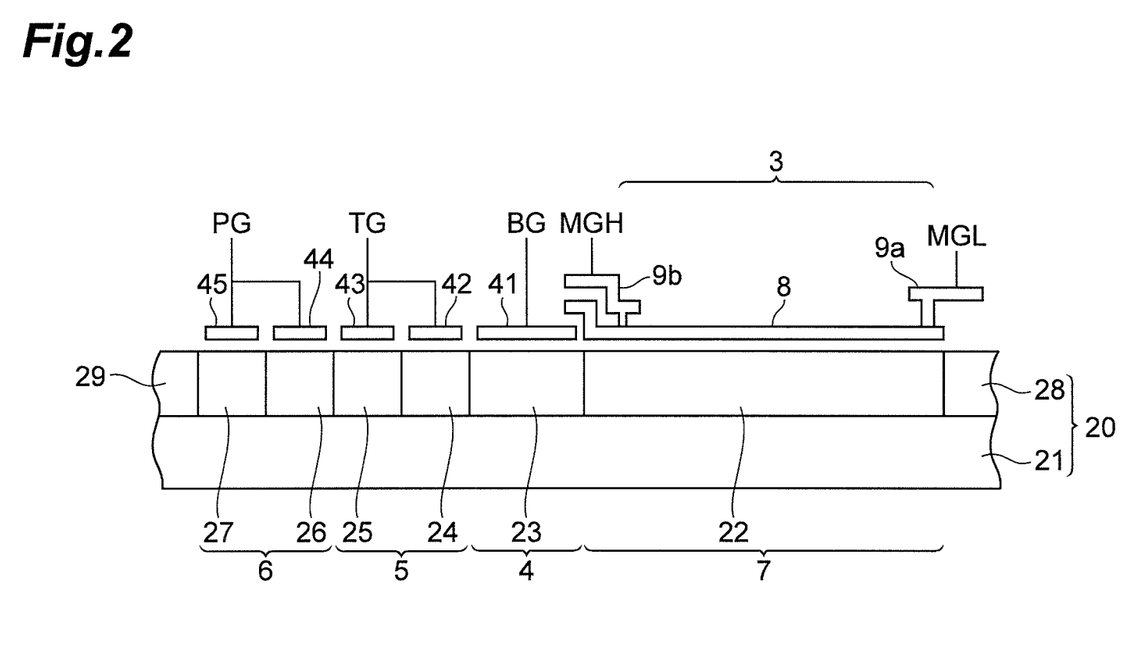
FIG. 2 is a drawing for explaining a sectional configuration along the line II-II in FIG. 1.
Figure 3:
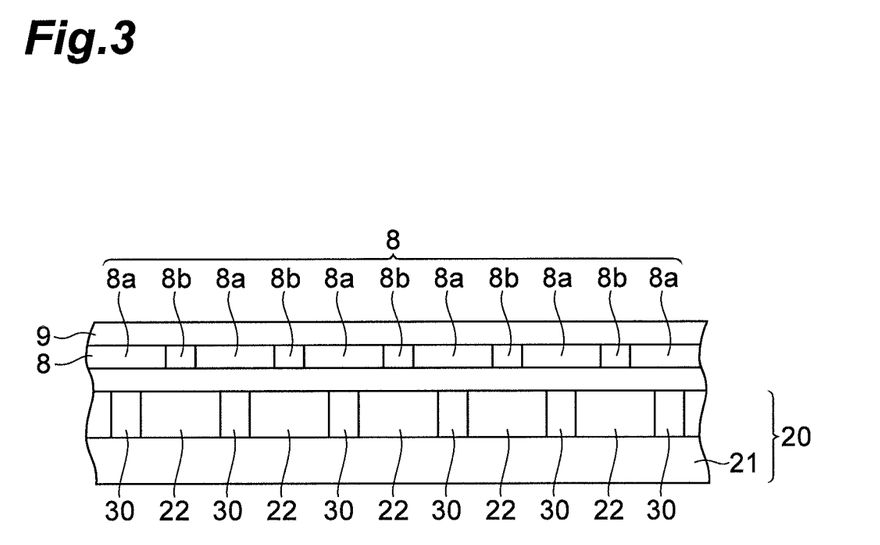
FIG. 3 is a drawing for explaining a sectional configuration along the line III-III in FIG. 1.

FIG. 1 is a plan view showing a configuration of a solid state imaging device according to an embodiment of the present invention. FIG. 2 is a drawing for explaining a sectional configuration along the line II-II in FIG. 1. FIG. 3 is a drawing for explaining a sectional configuration along the line III-III in FIG. 1.

The solid state imaging device 1 of the present embodiment is provided with a photoelectric conversion portion 2, a potential gradient forming portion 3, a plurality of buffer gate portions 4, a plurality of transfer portions 5, and a shift register 6 as a charge output portion. The solid state imaging device 1 can be used, for example, as a photodetection means of a spectroscope.

The photoelectric conversion portion 2 has a plurality of photosensitive regions 7 to generate respective charges according to incidence of light. A planar shape of each photosensitive region 7 is a nearly rectangular shape composed of two long sides and two short sides. The plurality of photosensitive regions 7 are juxtaposed in a first direction intersecting with the long sides (or arranged in an array pattern in a one-dimensional direction along the foregoing short sides herein). An isolation region (not shown) is arranged between each set of adjacent photosensitive regions 7 to electrically separate the photosensitive regions 7 from each other. In the present embodiment, the first direction is perpendicular to the long sides.

The potential gradient forming portion 3 has an electroconductive member 8 and a pair of electrodes 9a, 9b. The potential gradient forming portion 3 forms a potential gradient that becomes higher along a second direction from one of the short sides to the other of the short sides of each photosensitive region 7. The electroconductive member 8 is arranged so as to face each photosensitive region 7. The electrodes 9a, 9b are arranged respectively at the two end areas in the second direction of the electroconductive member 8. The electrode 9a is arranged at the end area beside the foregoing one short side and the electrode 9b at the end area beside the foregoing other short side. The electrodes 9a, 9b are arranged respectively inside the two ends in the second direction of the electroconductive member 8. The electrodes 9a, 9b may be arranged respectively at the two ends in the second direction of the electroconductive member 8.

The electroconductive member 8 includes a plurality of first regions 8a and a plurality of second regions 8b. The first regions 8a extend in the second direction between the electrodes 9a, 9b and have a first electric resistivity. The second regions 8b extend in the second direction between the electrodes 9a, 9b and have a second electric resistivity lower than the first electric resistivity. The first regions 8a and the second regions 8b are alternately arranged along the first direction. The plurality of second regions 8b are arranged at the same pitch as the plurality of photosensitive regions 7 are. The plurality of second regions 8b are arranged corresponding to the respective photosensitive regions 7. The electric resistance of the electroconductive member 8 is represented by a combined resistance of parallel connection of the electric resistance of the first regions 8a and the electric resistance of the second regions 8b.

Each one of the buffer gate portions 4 is arranged per photosensitive region 7, beside the other short side. Each buffer gate portion 4 is adjacent in the second direction to the corresponding photosensitive region 7. Namely, the plurality of buffer gate portions 4 are juxtaposed in the first direction beside the other short side. An isolation region (not shown) is arranged between each set of adjacent buffer gates 4 to electrically separate the buffer gates 4 from each other. Each buffer gate portion 4 acquires a charge generated and accumulated in the corresponding photosensitive region 7 and transfers the charge to the corresponding transfer portion 5.

Each one of the transfer portions 5 is arranged per buffer gate portion 4. Each transfer portion 5 is adjacent in the second direction to the corresponding buffer gate portion 4. Namely, the plurality of transfer portions 5 are juxtaposed in the first direction beside the other short side. An isolation region (not shown) is arranged between each set of adjacent transfer portions 5 to electrically separate the transfer portions 5 from each other. Each transfer portion 5 acquires a charge transferred from the corresponding buffer gate portion 4 and transfers the charge to the shift register 6.

The shift register 6 is adjacent in the second direction to each transfer portion 5. Namely, the shift register 6 is arranged beside the other short side. The shift register 6 acquires charges transferred from the respective transfer portions 5 and transfers the charges in the first direction to sequentially output them to an amplifier portion 10. The charges output from the shift register 6 are converted into respective voltages by the amplifier portion 10 and are output as the voltages correspond to the respective photosensitive regions 7 to the outside of the solid state imaging device 1.

The photoelectric conversion portion 2, the potential gradient forming portion 3, the plurality of buffer gate portions 4, the plurality of transfer portions 5, and the shift register 6 are formed on a semiconductor substrate 20, as shown in FIG. 2. The semiconductor substrate 20 includes a p-type semiconductor layer 21 as a base, a plurality of n-type semiconductor layers 22, 23, 25, 27, a plurality of n$^-$-type semiconductor layers 24, 26, and p$^+$-type semiconductor layers 28, 29 formed on one side of the p-type semiconductor layer 21. As shown in FIG. 3, the semiconductor substrate 20 includes p$^+$-type semiconductor layers 30 formed on the one side of the p-type semiconductor layer 21.

In the present embodiment, Si is used as a material of the substrate. "High impurity concentration" refers to an impurity concentration of not less than about $1\times10^{17}$ cm$^{-3}$, for example. "+" is attached to conductivity type to indicate "high impurity concentration." "Low impurity concentration" refers to an impurity concentration of not more than about $1\times10^{15}$ cm$^{-3}$, for example. "−" is attached to conductivity type to indicate "low impurity concentration." Examples of n-type impurities include arsenic, phosphorus, and so on, and examples of p-type impurities include boron and others.

As shown in FIG. 2, each n-type semiconductor layer 22 forms a pn junction with the p-type semiconductor layer 21 and each photosensitive region 7 is composed of each n-type semiconductor layer 22. Each photosensitive region 7 generates a charge according to incidence of light from the n-type semiconductor layer 22 side. A planar shape of each n-type semiconductor layer 22 is a nearly rectangular shape composed of two long sides and two short sides and the planar shape corresponds to the planar shape of each photosensitive region 7. The plurality of n-type semiconductor layers 22 are juxtaposed in the first direction. Each one of the p$^+$-type semiconductor layers 30 is arranged between a set of adjacent n-type semiconductor layers 22 and this p$^+$-type semiconductor layer 30 constitutes an isolation region between photosensitive regions 7 (cf. FIG. 3).

The electroconductive member 8 is arranged above each n-type semiconductor layer 22. The electroconductive member 8 is comprised of a material that transmits light (polysilicon herein), and is formed on each n-type semiconductor layer 22 through an insulating layer (not shown). The electrodes 9a, 9b are connected respectively to the two end areas in the second direction of the electroconductive member 8. The electrodes 9a, 9b are connected respectively to the two end areas in the second direction of the first regions 8a and the second regions 8b. The electroconductive member 8 and the electrodes 9a, 9b extend in the first direction and are formed across each n-type semiconductor layer 22 (cf. FIG. 1).

The electroconductive member 8 constitutes a so-called resistive gate. When a potential difference is given between the electrodes 9a, 9b (or when a voltage is applied), a potential gradient becoming higher from the one short side to the other short side of the n-type semiconductor layers 22 (along the second direction) is formed in the electroconductive member 8. The electrode 9a is given a signal MGL from a control circuit (not shown) and the electrode 9b a signal MGH from the control circuit (not shown). When the signal MGL and the signal MGH are at L-level, there is no potential gradient formed in the electroconductive member 8. A voltage applied at H-level of the signal MGL is different from a voltage applied at H-level of the signal MGH. The voltage applied at H-level of the signal MGH is higher than the voltage applied at H-level of the signal MGL. For this reason, with the signal MGL and the signal MGH at H-level, the potential gradient becoming higher along the second direction is formed in the electroconductive member 8.

Each one of the n-type semiconductor layers 23 is arranged per n-type semiconductor layer 22, beside the other short side. Each n-type semiconductor layer 23 is adjacent in the second direction to the corresponding n-type semiconductor layer 22. Namely, the plurality of n-type semiconductor layers 23 are juxtaposed in the first direction beside the other short side. Each n-type semiconductor layer 23 constitutes a buffer gate portion 4. As in the case of the n-type semiconductor layers 22, each one of the p$^+$-type semiconductor layers 30 is arranged between a set of adjacent n-type semiconductor layers 23 to constitute an isolation region between buffer gate portions 4.

An electrode 41 is arranged above each n-type semiconductor layer 23. The electrode 41 is formed on each n-type semiconductor layer 23 through an insulating layer (not shown). The electrode 41 extends in the first direction and is formed across each n-type semiconductor layer 23. The electrode 41 may be formed per the n-type semiconductor layer 23. The electrode 41 is given a signal BG to drive the buffer gate portions 4.

Each one of the n$^-$-type semiconductor layers 24 is arranged per n-type semiconductor layer 23. Each n$^-$-type semiconductor layer 24 is adjacent in the second direction to the corresponding n-type semiconductor layer 23. Namely, the plurality of n$^-$-type semiconductor layers 24 are juxtaposed in the first direction beside the other short side. The n-type semiconductor layers 25 are arranged for the respective n$^-$-type semiconductor layers 24. Each n-type semiconductor layer 25 is adjacent in the second direction to the corresponding n$^-$-type semiconductor layer 24. Namely, the plurality of n-type semiconductor layers 25 are juxtaposed in the first direction beside the other short side. Each pair of n$^-$-type semiconductor layer 24 and n-type semiconductor layer 25 constitutes a transfer portion 5. As in the case of the n-type semiconductor layers 22, each one of the p$^+$-type semiconductor layers 30 is arranged between a set of adjacent n$^-$-type semiconductor layers 24 and between a set of adjacent n-type semiconductor layers 25 to constitute an isolation region between transfer portions 5.

An electrode 42 is arranged above each n$^-$-type semiconductor layer 24. The electrode 42 is formed on the n$^-$-type semiconductor layers 24 through an insulating layer (not shown). An electrode 43 is arranged above each n-type semiconductor layer 25. The electrode 43 is formed on the n-type semiconductor layers 25 through an insulating layer (not shown). The electrodes 42, 43 extend in the first direction and are formed across each n$^-$-type semiconductor layer 24 and across each n-type semiconductor layer 25. The electrodes 42, 43 may be formed per the n$^-$-type semiconductor layer 24 and per the n-type semiconductor layer 25. The electrode 42 and the electrode 43 are given a signal TG to drive the transfer portions 5.

Each one of the n$^-$-type semiconductor layers 26 is arranged per n-type semiconductor layer 25. Each n$^-$-type semiconductor layer 26 is adjacent in the second direction to the corresponding n-type semiconductor layer 25. The plurality of n$^-$-type semiconductor layers 26 are juxtaposed in the first direction beside the other short side. Each one of the n-type semiconductor layers 27 is arranged per n$^-$-type semiconductor layer 26. Each n-type semiconductor layer 27 is adjacent in the second direction to the corresponding n⁻-type semiconductor layer 26. The n-type semiconductor layers 27 are juxtaposed in the first direction beside the other short side. The adjacent n⁻-type semiconductor layers 26 and adjacent n-type semiconductor layers 27 are in contact with each other. The plurality of n⁻-type semiconductor layers 26 and the plurality of n-type semiconductor layers 27 constitute the shift register 6.

An electrode 44 is arranged above each n⁻-type semiconductor layer 26. The electrode 44 is formed on the n⁻-type semiconductor layer 26 through an insulating layer (not shown). An electrode 45 is arranged above each n-type semiconductor layer 27. The electrode 45 is formed on the n-type semiconductor layer 27 through an insulating layer (not shown). The electrodes 44, 45 are formed per the n⁻-type semiconductor layer 26 and per the n-type semiconductor layer 27. Each electrode 44 and each electrode 45 are given a signal PG to drive the shift register 6.

The p⁺-type semiconductor layer 28 is adjacent in the second direction to the n-type semiconductor layers 22 beside the one short side. The p⁺-type semiconductor layer 29 is adjacent in the second direction to the n-type semiconductor layers 27. The p⁺-type semiconductor layers 28, 29 electrically separate the plurality of n-type semiconductor layers 22, 23, 25, 27 and the plurality of n⁻-type semiconductor layers 24, 26 from the other part of the semiconductor substrate 20. Each of the aforementioned insulating layers is comprised of a material that transmits light, e.g., a silicon oxide film. Each of the n-type semiconductor layers 23, 25, 27 and each of the n⁻-type semiconductor layers 24, 26 except for each n-type semiconductor layer 22, may be shielded from light, for example, by arranging a light shield member thereon. In this case, generation of unnecessary charge is prevented.

Figure 4:
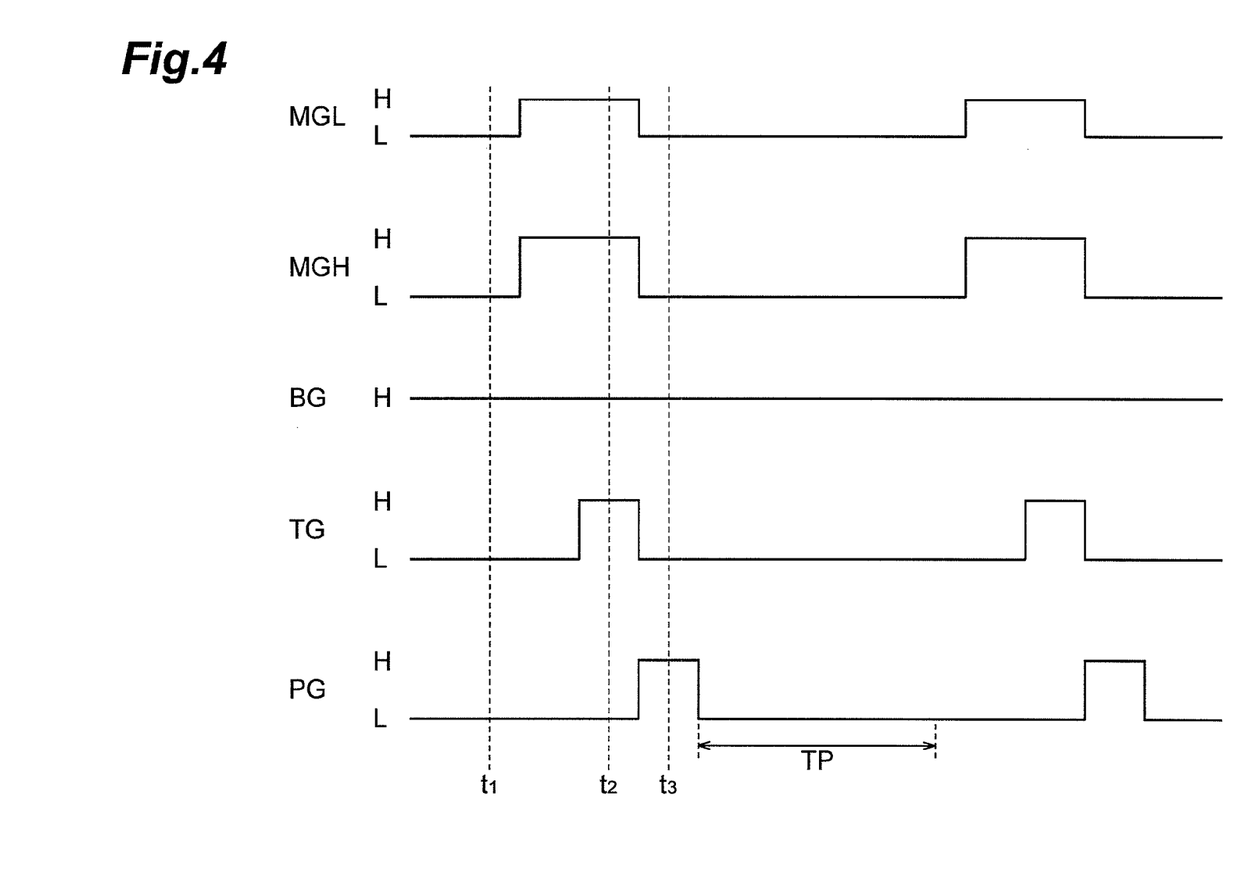
FIG. 4 is a timing chart of signals supplied in the solid state imaging device according to the embodiment.
Figure 5:
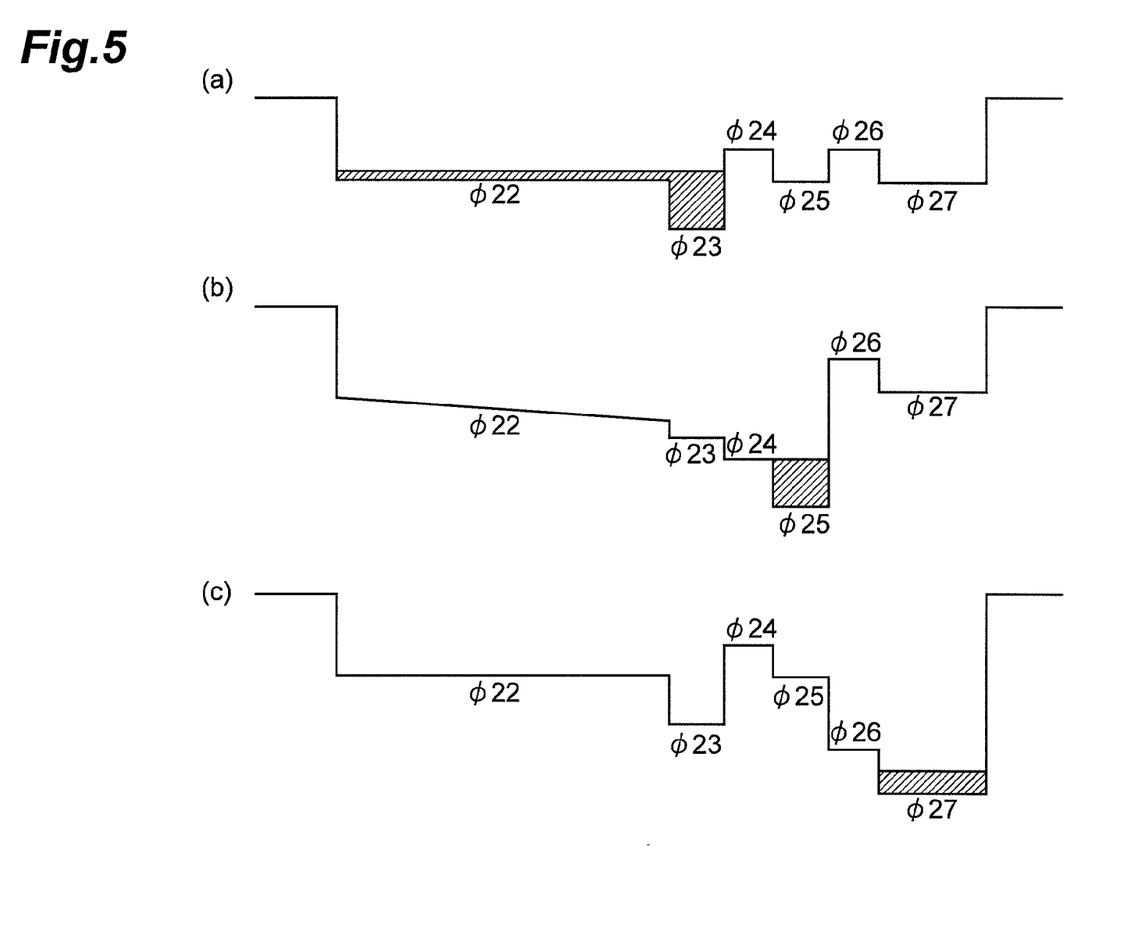
FIG. 5 is potential diagrams for explaining charge accumulation and drain operations at respective times in FIG. 4.

Next, operations in the solid state imaging device 1 will be described based on FIGS. 4 and 5. FIG. 4 is a timing chart of signals supplied in the solid state imaging device of the present embodiment. In FIGS. 5(a) to (c) are potential diagrams for explaining charge accumulation and drain operations at respective times in FIG. 4.

Incidentally, positively ionized donors exist in an n-type semiconductor, whereas negatively ionized acceptors exist in a p-type semiconductor. At a pn junction, a potential in n-type is higher than a potential in p-type. In other words, the positive direction for potentials in energy band diagrams is downward, and, therefore, a potential in an n-type semiconductor is deeper (or higher) than a potential in a p-type semiconductor in energy band diagrams. When a positive potential is applied to each electrode 9, 41-45, a potential in a semiconductor region immediately below the electrode becomes deeper (or larger in the positive direction). As the magnitude of the positive potential applied to each electrode is reduced, the potential of the semiconductor immediately below the corresponding electrode becomes shallower (or smaller in the positive direction).

When each of the signals MGL, MGH, TG, and PG is at L-level and the signal BG at H-level, e.g., at time t1 shown in FIG. 4, a potential $\phi 22$ of the n-type semiconductor layers 22 becomes deeper than those of the p⁺-type semiconductor layers 28 and the n⁻-type semiconductor layers 24 and a potential $\phi 23$ of the n-type semiconductor layers 23 becomes much deeper than the potential $\phi 22$. This process results in forming wells of the potentials $\phi 22$, $\phi 23$ (cf. FIG. 5(a)). When light is incident into the n-type semiconductor layers 22 in this state to generate respective charges, the generated charges are accumulated in the wells of the potentials $\phi 22$, $\phi 23$.

At time t2, when the signal MGL and the signal MGH are at H-level, the potential gradient becoming higher along the second direction is formed in the electroconductive member 8. In accordance with this potential gradient, the potential $\phi 22$ is inclined so as to become deeper toward the n-type semiconductor layers 23, whereby the charge accumulated in the well of the potential $\phi 22$ is moved into the well of the potential $\phi 23$. Namely, the charges generated and accumulated in the photosensitive regions 7 are acquired by the buffer gate portions 4. At the same time t2, when the signal TG is at H-level, a potential $\phi 24$ of the n⁻-type semiconductor layers 24 becomes deeper than the potential $\phi 23$ and a potential $\phi 25$ of the n-type semiconductor layers 25 becomes much deeper than the potential $\phi 24$. This process results in forming wells of the potentials $\phi 24$, $\phi 25$. The charges accumulated in the well of the potential $\phi 23$ are moved into the well of the potential $\phi 25$. Namely, the charges transferred from the buffer gate portions 4 are acquired by the transfer portions 5 (cf. FIG. 5(b)).

At time t3, when each of the signals MGL, MGH, and TG is at L-level and PG at H-level, a potential $\phi 26$ of the n⁻-type semiconductor layers 26 becomes deeper than the potential $\phi 25$ and a potential $\phi 27$ of the n-type semiconductor layers 27 becomes much deeper than the potential $\phi 26$. This process results in forming wells of the potentials $\phi 26$, $\phi 27$. The charges accumulated in the well of the potential $\phi 25$ are moved into the well of the potential $\phi 27$. Namely, the charges transferred from the transfer portions 5 are acquired by the shift register 6 (cf. FIG. 5(c)).

Thereafter, the charges acquired by the shift register 6 are sequentially transferred in the first direction during a charge transfer period TP to be output to the amplifier portion 10. The charge transfer in the first direction in the shift register 6 is performed using the signal PG and others, which is omitted from the illustration in FIG. 4.

Figure 6:
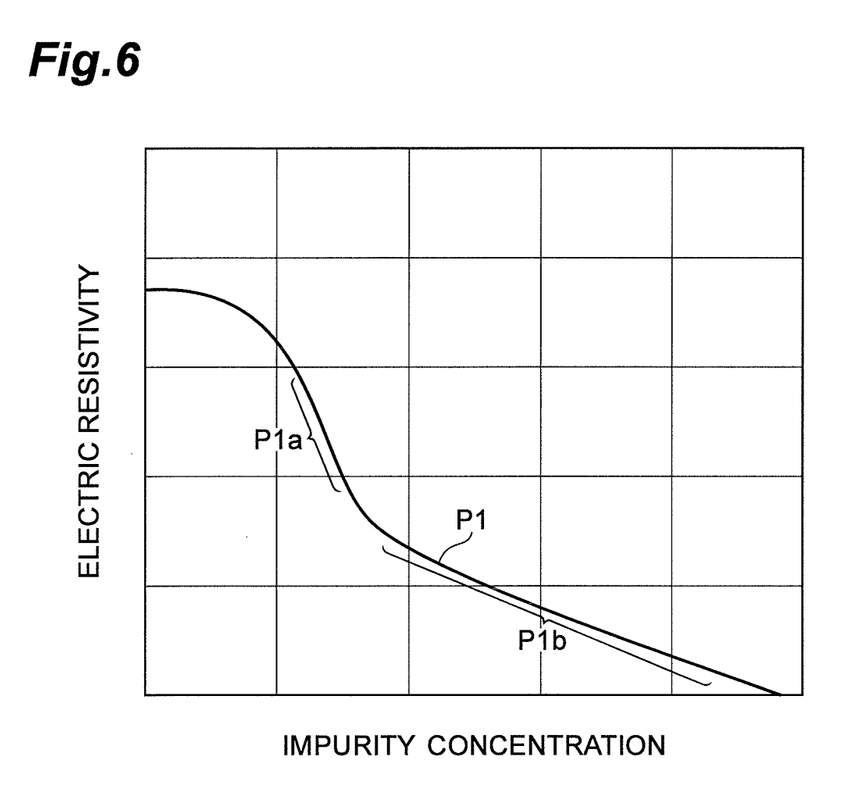
FIG. 6 is a graph showing relationship between impurity concentration and electric resistivity in polysilicon.

Next, the electric resistance of the electroconductive member 8 will be described based on FIG. 6. FIG. 6 is a graph showing relationship between impurity concentration and electric resistivity in polysilicon, in which the horizontal axis represents the impurity concentration and the vertical axis the electric resistivity. The electroconductive member 8 is comprised of polysilicon doped with an impurity. Curve P1 in FIG. 6 indicates a change characteristic of electric resistivity against concentration of the impurity added in polysilicon. The curve P1 shows such a tendency that the electric resistivity decreases with increase in impurity concentration and the gradient thereof becomes gentler. The gentle gradient of the curve P1 means that dispersion of electric resistivity is less likely to occur even with dispersion of impurity concentration.

The curve P1 has linear portions P1a, P1b where the gradient is constant. In the linear portion P1a and the linear portion P1b, the relationship between electric resistivity and impurity concentration is constant and likelihood of dispersion of electric resistivity is also constant. The linear portion P1b is located in a region of higher impurity concentrations than the linear portion P1a is. The gradient of the linear portion P1b is gentler than that of the linear portion P1a and the electric resistivities on the linear portion P1b are less likely to disperse than the electric resistivities on the linear portion P1a.

The electric resistance of the electroconductive member 8, i.e., the value of the combined resistance of the first regions 8a and the second regions 8b is set to a value enough to ensure the stability of operation and characteristics of the solid state imaging device 1. The value of the electric resistance of the electroconductive member 8 is set so as to achieve a sufficient readout speed for amounts of the charges generated in the photosensitive regions 7 and so as to prevent increase of dark current by suppression of an amount of heat generated in the electroconductive member 8. An average electric resistivity of the whole of the electroconductive member 8 corresponding to the set value of the electric resistance of the electroconductive member 8 is a predetermined value on the linear portion P1a. The aforementioned second electric resistivity is set to be smaller than the foregoing predetermined value and to be a value on the linear portion P1b. In contrast to it, the aforementioned first electric resistivity is set to a value larger than the predetermined value, in order to set the average electric resistivity of the entire electroconductive member 8 to the foregoing predetermined value. The set value of the first electric resistivity is a value on the linear portion P1a.

Since the value of the second electric resistivity is on the linear portion P1b, it is less likely to disperse than the aforementioned predetermined value on the linear portion P1a. Since the predetermined value and the value of the first electric resistivity both are on the linear portion P1a, the likelihood of dispersion is the same for the predetermined value and the value of the first electric resistivity. For this reason, the dispersion of electric resistance of the electroconductive member 8 is kept lower than in the case where the electric resistivity of the entire electroconductive member 8 is uniformly set at the predetermined value.

In the present embodiment, as described above, the electroconductive member 8 includes the first regions 8a having the first electric resistivity and the second regions 8b having the second electric resistivity smaller than the first electric resistivity. Since the first regions 8a and the second regions 8b have the different electric resistivities, dispersions thereof are also different. The electroconductive member 8 in the present embodiment is comprised of polysilicon doped with the impurity and the dispersion of the second regions 8b is less likely to occur depending upon properties of polysilicon. For this reason, the dispersion of electric resistivity is kept lower in view of the whole of the electroconductive member 8.

The electric resistance of the electroconductive member 8 is represented by the combined resistance of parallel connection of the electric resistance of the first regions 8a and the electric resistance of the second regions 8b. Therefore, it is sufficient that the value of the combined resistance of the electric resistance of the first regions 8a and the electric resistance of the second regions 8b be set at the predetermined value enough to ensure the stability of operation and characteristics of the solid state imaging device 1. In the present embodiment, by adjusting the first electric resistivity while setting the second electric resistivity to the value less likely to disperse, the electric resistance of the electroconductive member 8 is readily adjusted to the value enough to ensure the stability of operation and characteristics of the solid state imaging device 1. For this reason, the constraints on the electric resistance of the electroconductive member 8 do not affect the suppression of dispersion by the second regions 8b.

In the present embodiment, the electroconductive member 8 includes the plurality of first regions 8a and the plurality of second regions 8b and the first regions 8a and the second regions 8b are alternately arranged along the first direction. This configuration allows the charge readout speed and the amount of heat generated in the electroconductive member 8 to be kept approximately uniform in the first direction, which makes the operation and characteristics of the solid state imaging device 1 more stabilized.

The second regions 8b are arranged corresponding to the respective photosensitive regions 7. This configuration makes the charge readout speed and the amount of heat generated in the electroconductive member, approximately uniform in each of the photosensitive regions 7, which makes the operation and characteristics of the solid state imaging device 1 more stabilized.

The potential gradient forming portion 3 is provided with the pair of electrodes 9a, 9b connected respectively to the two end areas of the electroconductive member 8 extending along the first direction, and the electrodes 9a, 9b are formed across each photosensitive region 7. This configuration makes the potentials at the two ends of the electroconductive member 8 approximately uniform in the first direction, and forms the potential gradient approximately uniform in the first direction; therefore, it makes the operation and characteristics of the solid state imaging device 1 more stabilized.

The above described the preferred embodiment of the present invention, but it should be noted that the present invention is by no means limited to the aforementioned embodiment and the present invention can be modified in many ways without departing from the spirit and scope of the invention.

Figure 7:
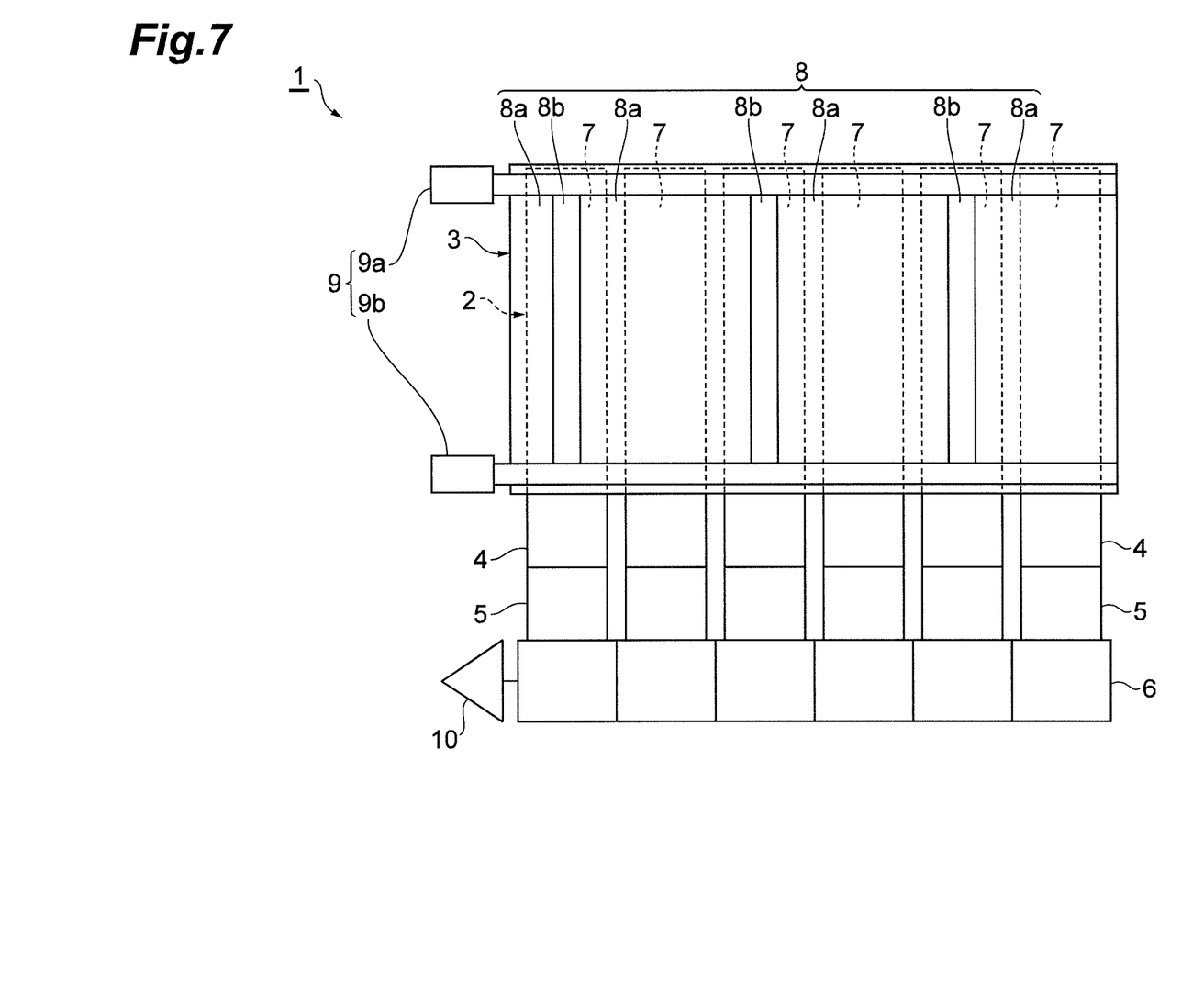
FIG. 7 is a plan view showing a configuration of a modification of the solid state imaging device according to the embodiment.

The embodiment showed the example wherein the second regions 8b were arranged corresponding to the respective photosensitive regions 7, and the present invention is not limited to this example. For example, as shown in FIG. 7, the second regions 8b may be arranged each for a plurality of photosensitive regions 7. In the solid state imaging device 1 shown in FIG. 7, the electric resistance of the electroconductive member 8 set so as to ensure the stability of operation and characteristics is set to be equal to that in the solid state imaging device 1 shown in FIG. 1. In this case, the sum of the areas of the first regions 8a and the sum of the areas of the second regions 8b are set to be equal to the respective sums in the solid state imaging device 1 shown in FIG. 1. For this reason, in the solid state imaging device 1 shown in FIG. 7, the individual areas of the first regions 8a and the second regions 8b can be set larger, which allows the electroconductive member 8 to be readily formed. A plurality of second regions 8b may be arranged per photosensitive region 7. In this case, the charge readout speed and the amount of heat generated in the electroconductive member 8 become much more uniform in the first direction.

The electroconductive member 8 and the electrodes 9a, 9b extend in the first direction and are formed across each photosensitive region 7, but they may be formed as divided into a plurality of segments.

The photosensitive regions 7 are arranged in the array pattern in the one-dimensional direction along the short sides, but they may also be arranged in the direction along the long sides, and arranged in an array pattern in two-dimensional directions along the short-side direction and the long-side direction.

The solid state imaging device 1 is a front illuminated type in which light is incident from the n-type semiconductor layer 22 side, but the present invention is not limited to this type. The solid state imaging device 1 may be a back illuminated type in which light is incident from the p-type semiconductor layer 21 side.

INDUSTRIAL APPLICABILITY

The present invention is applicable to the photodetection means of spectroscope.

LIST OF REFERENCE SIGNS 1 solid state imaging device; 2 photoelectric conversion portion; 3 potential gradient forming portion; 6 shift register;

7 photosensitive region; 8 electroconductive member; 8a first region; 8b second region; 9 electrodes; 10 amplifier portion.

The invention claimed is:

1. A solid state imaging device comprising:
    a photoelectric conversion portion having a plurality of photosensitive regions which generate respective charges according to incidence of light and a planar shape of each of which is a substantially rectangular shape composed of two long sides and two short sides, the photosensitive regions being juxtaposed in a first direction intersecting with the long sides;
    a potential gradient forming portion having an electroconductive member arranged opposite to the plurality of photosensitive regions, and forming a potential gradient becoming higher along a second direction from one of the short sides to the other of the short sides of the photosensitive regions; and
    a charge output portion which acquires the charges transferred from the respective photosensitive regions and which transfers the charges in the first direction to output the charges,
    wherein the electroconductive member includes a first region extending in the second direction between two ends in the second direction and having a first electric resistivity, and a second region extending in the second direction between the two ends and having a second electric resistivity smaller than the first electric resistivity.

2. The solid state imaging device according to claim 1,
    wherein the electroconductive member is comprised of polysilicon doped with an impurity, and
    wherein a concentration of the impurity in the second region is higher than in the first region.

3. The solid state imaging device according to claim 1,
    wherein the electroconductive member includes a plurality of the first regions and a plurality of the second regions, and
    wherein the first regions and the second regions are alternately arranged along the first direction.

4. The solid state imaging device according to claim 3,
    wherein the second regions are arranged corresponding to the respective photosensitive regions.

5. The solid state imaging device according to claim 1,
    wherein the potential gradient forming portion further includes a pair of electrodes connected respectively to the two ends thereof and extending along the first direction.

* * * * *